United States Patent
Münzinger et al.

(10) Patent No.: US 12,508,643 B2
(45) Date of Patent: Dec. 30, 2025

(54) METHOD FOR PRODUCING A HEAT SINK HAVING FINS AND A PERIPHERAL SIDE WALL

(71) Applicant: Siemens Aktiengesellschaft, Munich (DE)

(72) Inventors: Marius Münzinger, Nuremberg (DE); Christoph Nöth, Eckental (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/862,852

(22) PCT Filed: Mar. 23, 2023

(86) PCT No.: PCT/EP2023/057401
§ 371 (c)(1),
(2) Date: Nov. 4, 2024

(87) PCT Pub. No.: WO2023/213471
PCT Pub. Date: Nov. 9, 2023

(65) Prior Publication Data
US 2025/0276356 A1     Sep. 4, 2025

(30) Foreign Application Priority Data
May 5, 2022  (EP) ..................... 22171735

(51) Int. Cl.
*B21D 53/02* (2006.01)
*H01L 21/48* (2006.01)
*H01L 23/367* (2006.01)

(52) U.S. Cl.
CPC ........ *B21D 53/022* (2013.01); *H01L 21/4878* (2013.01); *H01L 23/3672* (2013.01); *H01L 23/3677* (2013.01); *Y10T 29/4935* (2015.01)

(58) Field of Classification Search
CPC ... B21D 53/02; B21D 53/022; B23P 2700/10; F28F 2255/16
See application file for complete search history.

(56) References Cited

U.S. PATENT DOCUMENTS 6,134,783 A * 10/2000 Bargman ............ H01L 21/4878
                                                      165/185
6,367,152 B1 * 4/2002 Kataoka .................. B23P 15/26
                                                      165/185

(Continued)

FOREIGN PATENT DOCUMENTS

DE        10014458 A1    10/2001
DE    102005007343 A1 *  8/2006    ........... H01L 23/467

(Continued)

OTHER PUBLICATIONS

English Machine Translation of DE-102005007343-A1 (Year: 2005).*

(Continued)

*Primary Examiner* — Sarang Afzali
(74) *Attorney, Agent, or Firm* — Henry M. Feiereisen LLC

(57) ABSTRACT

In a method for producing a heat sink, a semifinished product of a first metal material is placed into a die and a material layer of a second metal material of a higher thermal conductivity than the first metal material is releasably connected to a pressure surface of a punch. The punch is brought into contact via the material layer with the semifinished product in the die. The heat sink is formed by pressing the first metal material of the semifinished product by the punch through openings of the die fins of the heat sink are formed and into a peripheral rebate of the punch a peripheral side wall of the heat sink, wherein the material layer is connected over its entire surface to the first metal material of the (Continued)

semifinished product. The punch is released from the material layer, and the heat sink is ejected from the die.

14 Claims, 6 Drawing Sheets

(56) References Cited

U.S. PATENT DOCUMENTS

| | | | |
|---|---|---|---|
| 9,555,505 B2 * | 1/2017 | Kokubo | ................ B21C 23/186 |
| 2019/0224740 A1 | 7/2019 | Igarashi | |
| 2022/0143676 A1 * | 5/2022 | Holzhauer | ............ B21C 23/183 |
| 2022/0381360 A1 | 12/2022 | Kalyanasundaram et al. | |
| 2023/0238374 A1 | 7/2023 | Schmenger et al. | |

FOREIGN PATENT DOCUMENTS

| | | | | |
|---|---|---|---|---|
| DE | 202006010766 U1 * | 10/2006 | ......... | H01L 21/4882 |
| DE | 102007061599 A1 | 7/2009 | | |
| DE | 102019001383 A1 | 8/2022 | | |
| EP | 3466559 A1 | 4/2019 | | |
| EP | 3933913 A1 | 1/2022 | | |
| JP | S5112370 A | 1/1976 | | |
| JP | 2015050318 A | 3/2015 | | |
| WO | WO 2021058212 A1 | 4/2021 | | |

OTHER PUBLICATIONS

English Machine Translation of DE-202006010766-U1 (Year: 2006).*
PCT International Search Report and Written Opinion of International Searching Authority mailed May 19, 2023 corresponding to PCT International Application No. PCT/EP2023/057401 filed Mar. 23, 2023.

* cited by examiner

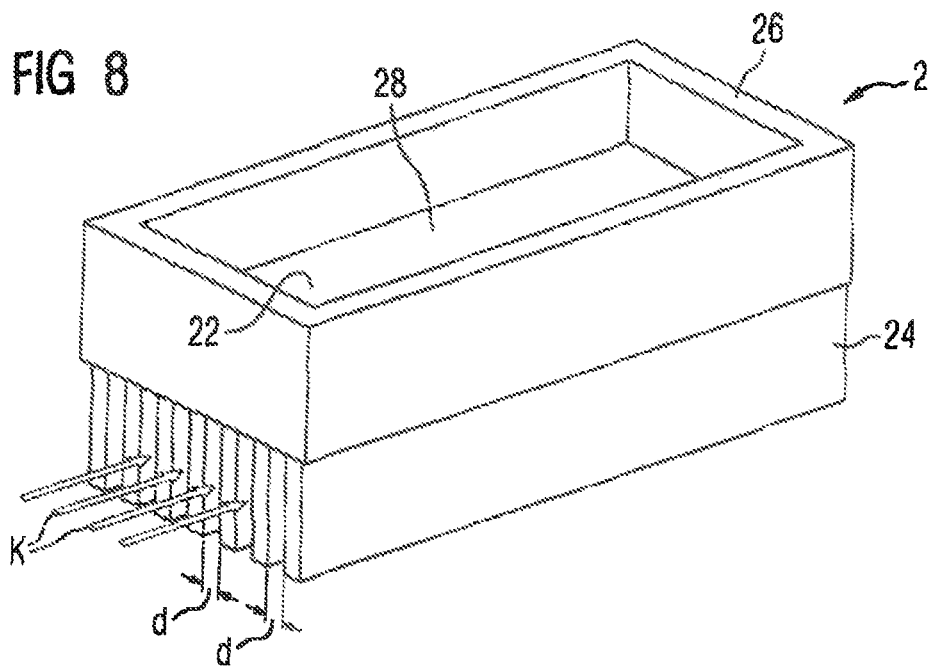
FIG 8
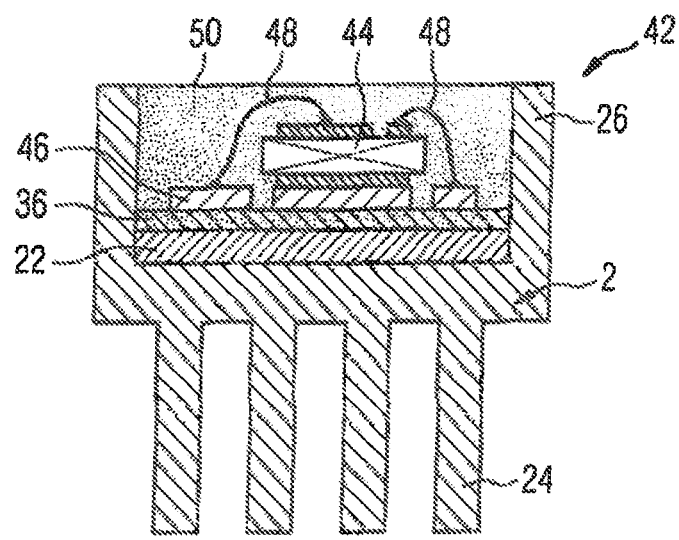
FIG 9
FIG 10
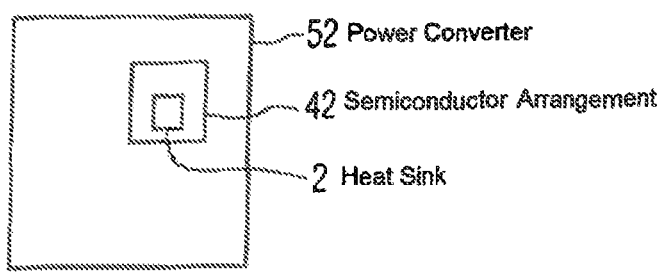

METHOD FOR PRODUCING A HEAT SINK HAVING FINS AND A PERIPHERAL SIDE WALL

CROSS-REFERENCES TO RELATED APPLICATIONS

This application is the U.S. National Stage of International Application No. PCT/EP2023/057401, filed Mar. 23, 2023, which designated the United States and has been published as International Publication No. WO 2023/213471 A1 and which claims the priority of European Patent Application, Serial No. 22171735.8, filled May 5, 2022, pursuant to 35 U.S.C. 119 (a)-(d).

BACKGROUND OF THE INVENTION

The invention relates to a method for producing a heat sink with fins and a peripheral side wall by extrusion.

Moreover, the invention relates to a heat sink for a semiconductor arrangement, the heat sink being produced by such an extrusion process.

In addition, the invention relates to a semiconductor arrangement with at least one semiconductor element and a heat sink.

Furthermore, the invention relates to a power converter with at least one semiconductor arrangement.

Semiconductor arrangements are generally attached to a heat sink in such power converters. A power converter is to be understood to be, by way of example, a rectifier, an inverter, a converter or a DC-DC converter. The semiconductor arrangements are usually configured as electronic modules which have a casing and are screwed via a solid metal base plate to the heat sink. Moreover, the semiconductor arrangements are directly connected to the heat sink. The semiconductor arrangements may include, inter alia, insulated-gate bipolar transistors (IGBTs) and/or metal oxide semiconductor field-effect transistors (MOSFETs).

The published patent application EP 3 933 913 A1 describes a power module with at least two power units, each comprising at least one power semiconductor and one substrate. In order to reduce the installation space required for the power module and to improve heat dissipation, it is proposed that the at least one power semiconductor is connected in each case to the respective substrate, in particular in a material-bonded manner, wherein the substrates of the at least two power units are each directly connected to a surface of a common heat sink in a material-bonded manner.

In order to fulfill the high insulation requirements in the case of such electronic modules, the semiconductors and connecting means, for example bonding wires, are covered by a casting compound. In addition, the casting compound prevents the penetration of moisture and corrosion of the components.

The published patent application WO 2021/058212 A1 describes a carrier for at least one electrical component. The carrier comprises a heat sink with a heat sink surface and two side walls which protrude from the heat sink surface and lie opposite each other, two sealing blocks which rest on the surface of the heat sink, are spaced apart from one another and each run between the two side walls and rest against each of the two side walls, and a carrier structure for the at least one electrical component, the carrier structure being arranged on the surface of the heat sink between the two sealing blocks.

In view of this, it is an object of the present invention to provide a cost-effective method for producing a heat sink.

SUMMARY OF THE INVENTION

The object is achieved according to the invention by a method for producing a heat sink with fins and a peripheral side wall by extrusion, comprising the following steps: providing a die, which has a base surface, and a punch, which has a pressure surface, wherein the base surface of the die has openings, wherein a peripheral rebate is formed on the pressure surface of the punch, placing a semifinished product made of a first metal material into the die, releasably connecting a material layer made of a second metal material, which has a higher thermal conductivity than the first metal material, to the pressure surface of the punch, bringing the punch into contact via the material layer with the semifinished product that is placed in the die, pressing the first metal material of the semifinished product by means of the punch through the openings of the die so as to form the fins and into the peripheral rebate of the punch so as to form the peripheral side wall, wherein the material layer is connected over its entire surface to the first metal material of the semifinished product, wherein the heat sink is formed by the pressing, releasing the punch from the material layer, ejecting the heat sink from the die.

Moreover, the object is achieved according to the invention by a heat sink for a semiconductor arrangement, the heat sink being produced by such an extrusion process, having fins which are produced by pressing the semifinished product by means of a pressure surface of the punch through openings of the die, a peripheral side wall which is arranged on a side of the heat sink lying opposite the fins and is produced by pressing the semifinished product into a peripheral rebate of the punch, a planar surface within the peripheral side wall which is formed by the pressure surface of the punch and comprises the material layer made of the second metal material.

In addition, the object is achieved according to the invention by a semiconductor arrangement with at least one semiconductor element and such a heat sink, wherein the semiconductor element is connected to the heat sink in an electrically insulated and thermally conductive manner.

Moreover, the object is achieved according to the invention by a power converter with at least one such semiconductor arrangement.

The advantages and preferred embodiments mentioned below with regard to the method can be expediently transferred to the heat sink, the semiconductor arrangement and the power converter.

The invention is based on the consideration of producing a heat sink with a peripheral side wall, fins and a heat-spreading surface by extrusion in order to achieve an improved cost position. The heat sink is produced by means of a semifinished product made of a first metal material. By way of example, the first metal material is an aluminum alloy, in particular a wrought aluminum alloy. The heat-spreading surface is produced by means of a material layer made of a second metal material which has a higher thermal conductivity than the first metal material. The second metal material is copper or a copper alloy, by way of example. By way of example, the material layer is designed as a copper sheet.

The extrusion process is performed by means of a die, which has a base surface, and a punch, which has a pressure surface. The base surface of the die can, inter alia, be designed in dependence upon the desired shape of the heat sink, in a rectangular, in particular square, or elliptical, in particular circular, shape and has openings. The openings can, inter alia, be designed in a rectangular, in particular square, or elliptical, in particular circular, shape. A peripheral rebate which is produced by way of example by means of a material-removing process, in particular by milling, is formed on the pressure surface of the punch. The rebate is designed by way of example as a stepped rebate with a rectangular or trapezoidal profile.

The material layer is connected to the pressure surface of the punch in a releasable manner. The releasable connection can be produced by way of example adhesively by means of a releasable adhesive. A releasable adhesive connection of the material layer advantageously prevents any displacement during the pressing procedure. After the semifinished product made of a first metal material has been placed in the die, the punch is brought into contact via the material layer with the semifinished product that is placed into the die. Subsequently, the first metal material of the semifinished product is pressed by means of the punch through the openings of the die so as to form the fins and into the peripheral rebate of the punch so as to form the peripheral side wall, wherein the metal layer is connected over its entire surface to the first metal material of the semifinished product so as to form the heat-spreading surface. The heat sink is formed by the pressing procedure. The procedure is carried out, by way of example, by means of can extrusion, in particular by means of forward can extrusion. In a further step, the punch is released from the material layer and the heat sink is ejected from the die. After the extrusion, no further steps, such as by way of example joining the material layer so as to spread heat, are required, which means that costs can also be saved for smaller quantities.

A further embodiment provides that after the pressing the fins are cut to length, in particular flush, in the die. Immediately after the extrusion, the fins may have different lengths and/or protrude irregularly from the openings of the die. The fins are cost-effectively shortened to a uniform final length by cutting, by way of example using a sawing, milling and/or cutting apparatus.

A further embodiment provides that the material layer is releasably connected to the punch in such a way that the material layer is flush with the pressure surface of the punch. Such an arrangement allows a cost-effective method of producing a maximum-sized heat-spreading surface.

A further embodiment provides that the material layer is connected in a material-bonded manner to the first metal material via a pressure welding connection. Such a connection is robust and inexpensive to produce. Furthermore, the thermal resistance between the second metal material of the material layer and the first metal material is reduced, especially in comparison to a soldered or sintered connection.

A further embodiment provides that the material layer is roughened on a side facing away from the pressure surface of the punch. Such a roughened surface can be produced in a cost-effective manner and improves the interlocking between the second metal material of the material layer and the first metal material.

A further embodiment provides that the material layer is connected to the first metal material via micro-interlocks. In particular, a roughened surface allows such a connection to be produced in a robust and cost-effective manner via micro-interlocks.

A further embodiment provides that the openings of the die are designed as elongated holes, wherein the first metal material of the semifinished product is pressed through the elongated holes of the die so as to form lamellar fins. The elongated holes can be angular or rounded. Optimal heat dissipation can be achieved by lamellar fins, in particular with a lateral cooling fluid flow.

A further embodiment provides that a dielectric material layer is releasably connected between the pressure surface of the punch and the material layer made of the second metal material, wherein the dielectric material layer is non-releasably connected to the material layer during the pressing. The dielectric material layer comprises, by way of example, an organic insulator. The organic insulator can be filled, inter alia, with a ceramic material such as aluminum oxide and/or aluminum nitride. The dielectric material layer is pressed cost-effectively and easily with the material layer by the pressure of the punch.

A further embodiment provides that the die has an inner shell surface and the punch has an outer shell surface, wherein during the pressing the outer shell surface of the punch is moved running parallel flush with respect to the inner shell surface of the die. This avoids the need for any post-processing of the heat sink, which saves additional costs.

A further embodiment provides that an aluminum alloy, in particular a wrought aluminum alloy, is used for the first metal material. Such an alloy is particularly malleable, allowing the production of fins with a high length-to-spacing ratio, which results in improved cooling performance.

A further embodiment provides for the use of an aluminum alloy containing silicon in a proportion by weight in the range of 0.1% to 1%, in particular in the range of 0.1% to 0.5%. The aluminum alloy can be, inter alia, EN AW 6060 (AlMgSi0.5). In the case of a heat sink produced by extrusion, especially in comparison to a cast heat sink, it is possible to use such a low silicon content of the aluminum alloy, which leads to improved thermal conductivity.

BRIEF DESCRIPTION OF THE DRAWING

In the following, the invention will be described and explained in more detail with reference to the exemplary embodiments shown in the figures.

It is shown in.

DETAILED DESCRIPTION OF PREFERRED EMBODIMENTS

The exemplary embodiments which are explained below are preferred embodiments of the invention. In the exemplary embodiments, the described components of the embodiments each represent individual features of the invention which are to be considered independently of one another and which each also develop the invention independently of one another and are thus also to be regarded as a component of the invention individually or in a combination other than that shown. Furthermore, the embodiments described can also be supplemented by further of the features of the invention already described.

Identical reference signs have the same meaning in the various figures.

Figure 1:
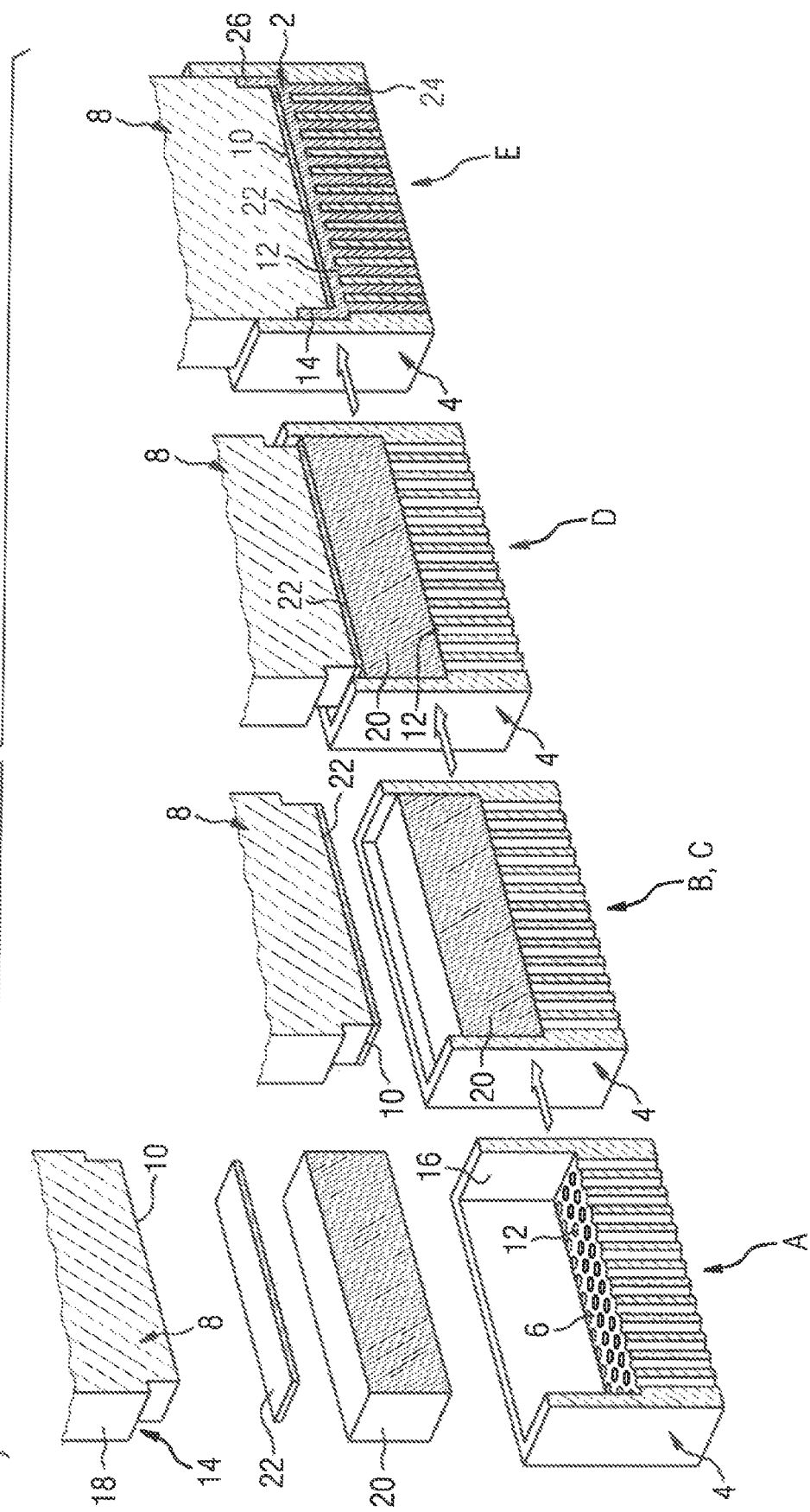
FIG. 1 a schematic three-dimensional sectional view of a method for producing a heat sink, FIG. 2 a schematic three-dimensional sectional view of a further method step for producing a heat sink, FIG. 3 a schematic three-dimensional representation of a heat sink with cylindrical fins, FIG. 4 a schematic sectional view of further method steps for producing a heat sink, FIG. 5 a schematic sectional view of a heat sink with a dielectric material layer, FIG. 6 a schematic representation of a die with openings in the form of rectangular elongated holes, in a plan view, FIG. 7 a schematic representation of a die with openings in the form of rounded elongated holes, in a plan view, FIG. 8 a schematic three-dimensional representation of a heat sink with lamellar fins, FIG. 9 a schematic sectional view of a semiconductor arrangement with a heat sink, and FIG. 10 a schematic representation of a power converter.

FIG. 1 shows a schematic three-dimensional sectional view of a method for producing a heat sink 2 by extrusion. The heat sink 2 is produced by a forward extrusion process, in particular by a forward can extrusion process. The method comprises providing A a die 4, which has a base surface 6, and a punch 8, which has a pressure surface 10. The base surface 6 of the die 4 has by way of example round openings 12 for forming cylindrical cooling fins. A peripheral rebate 14, in particular a stepped rebate, is formed on the pressure surface 10 of the punch 8. Moreover, the die 4 has an inner shell surface 16 and the punch 8 has an outer shell surface 18, wherein the outer shell surface 18 of the punch 8 is dimensioned in such a way that it can be moved running parallel flush with respect to the inner shell surface 16 of the die 4. Moreover, a semifinished product 20 is produced from a first metal material and a material layer 22 is produced from a second metal material. The second metal material has a higher thermal conductivity than the first metal material. By way of example, the first metal material is an aluminum alloy, in particular a wrought aluminum alloy, which contains silicon in a proportion by weight of less than 1%, in particular less than 0.5%. The first metal material can be, inter alia, EN AW 6060 (AlMgSi0.5). The second metal material is copper or a copper alloy, by way of example. By way of example, the material layer 22 is designed as copper sheet.

In a further step, the semifinished product 20 made of the first metal material is placed B into the die 4. The semifinished product 20 is designed by way of example with a cuboid shape and adapted to the inner shell surface 16 of the die 4. Furthermore, the material layer 22 made of the second metal material is releasably connected C to the pressure surface 10 of the punch 8. The releasable connection can be produced by way of example adhesively by means of a releasable adhesive. Alternatively, the material layer 22 can be releasably connected to the semifinished product 20. A releasable connection of the material layer 22 to the semifinished product 20 can also include placing the material layer 22 on an in particular planar surface of the cuboid semifinished product 20. A releasable adhesive connection of the material layer 22 prevents displacement during the pressing procedure.

In a further step, the punch 8 is brought into contact D via the material layer 22 with the semifinished product 20 that is placed in the die 4. In particular, the material layer 22 is in contact over its entire surface with the surface of the cuboid semifinished product 20.

Furthermore, the semifinished product 20 is pressed E by means of the punch 8 so as to form the heat sink 2. The first metal material of the semifinished product 20 is pressed through the openings 12 of the die 4 so as to form the fins 24 and into the peripheral rebate 14 of the punch 6 so as to form the peripheral side wall 26. The material layer 22 is roughened on a side facing away from the pressure surface 10 of the punch 8. The pressure generated by means of the pressing procedure causes the roughened material layer 22 to be connected over its entire surface to the first metal material via micro-interlocks. In addition or as an alternative, the connection is made in a material-bonded manner by means of pressure welding.

Figure 2:
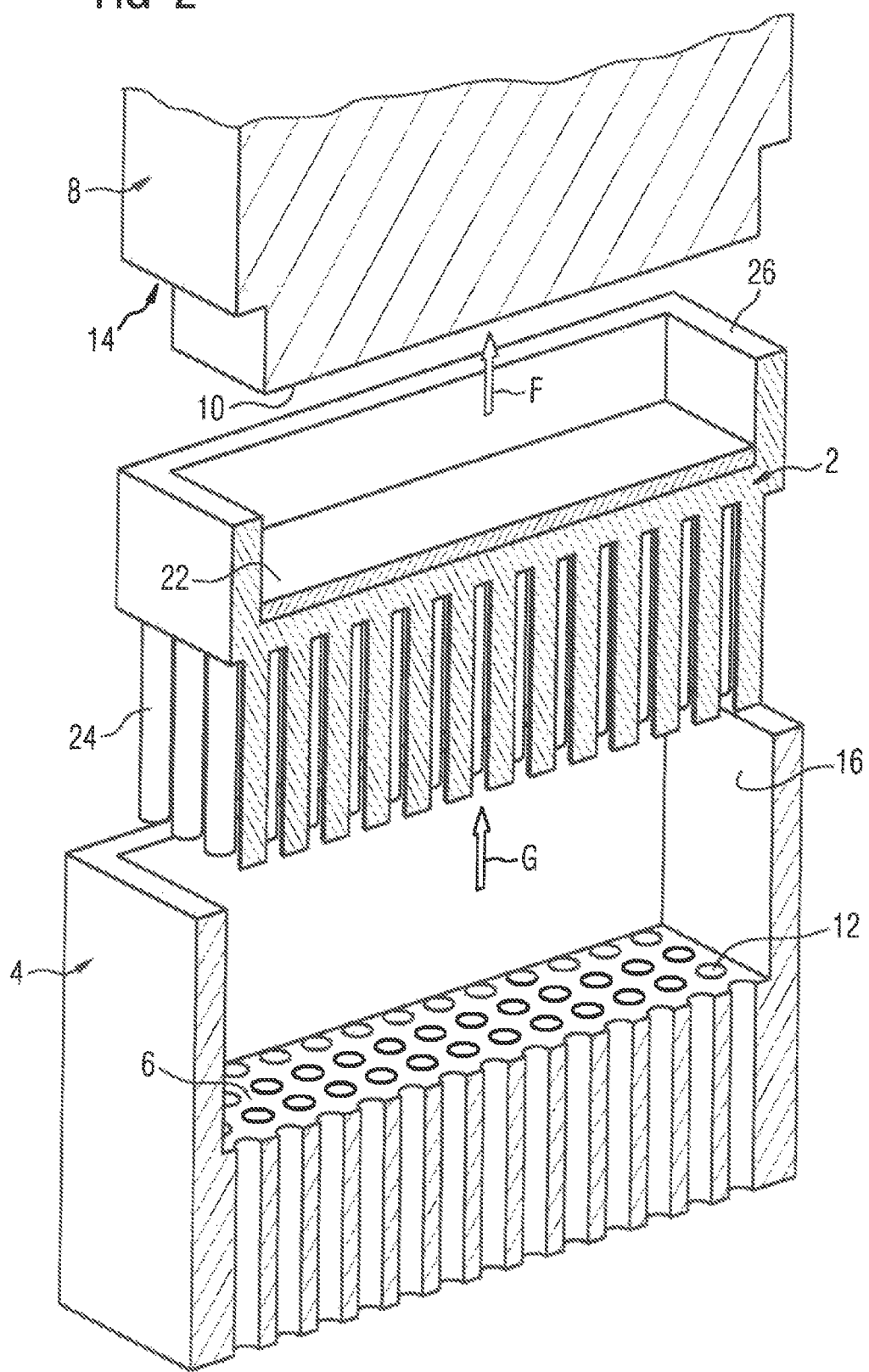

FIG. 2 shows a schematic three-dimensional sectional view of a further method step for producing a heat sink 2, which includes releasing F the punch 8 from the material layer 22 and ejecting F the heat sink 2 from the die 4. Ejection means are not shown in FIG. 2 for reasons of clarity. The further configuration of the method in FIG. 2 corresponds to that in FIG. 1.

Figure 3:
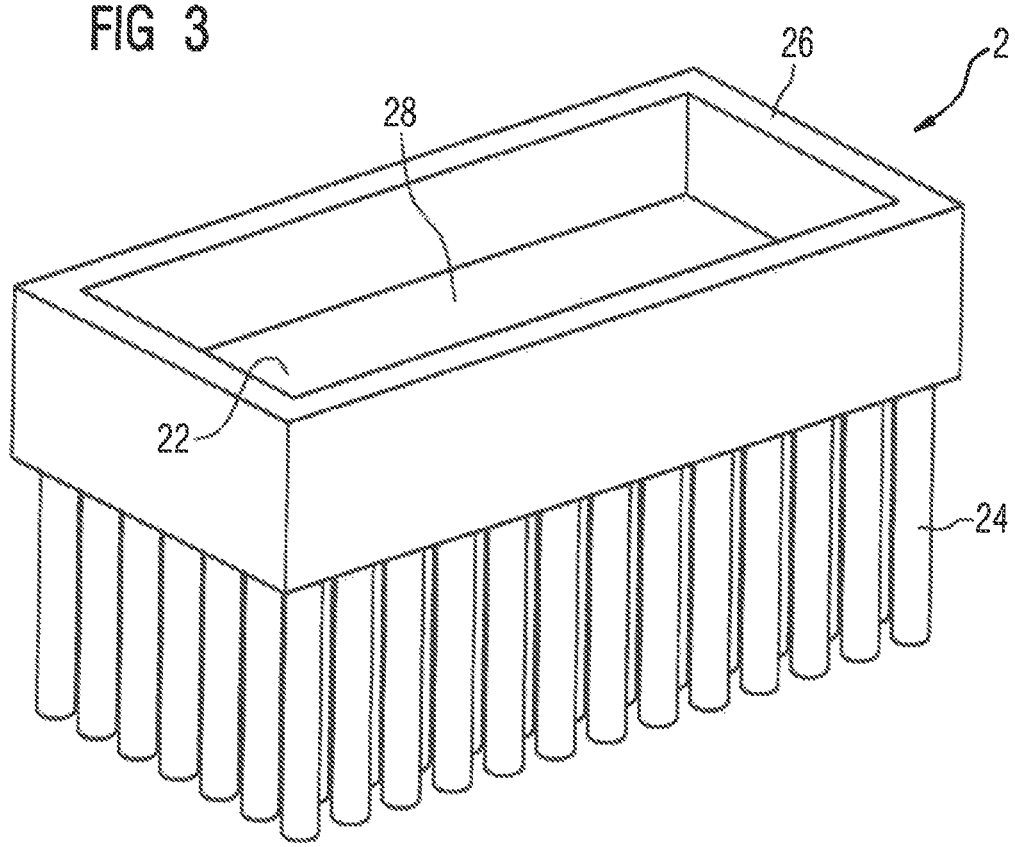

FIG. 3 shows a schematic three-dimensional representation of a heat sink 2 with cylindrical fins 24. The material layer 22 comprises copper and forms by way of example a rectangular, planar contact surface 28 for making in particular surface contact with electronic components, such as for example power semiconductors. Heat is spread by the material layer 22 during the operation of an electronic component. The further configuration of the heat sink 2 in FIG. 3 corresponds to that in FIG. 2.

Figure 4:
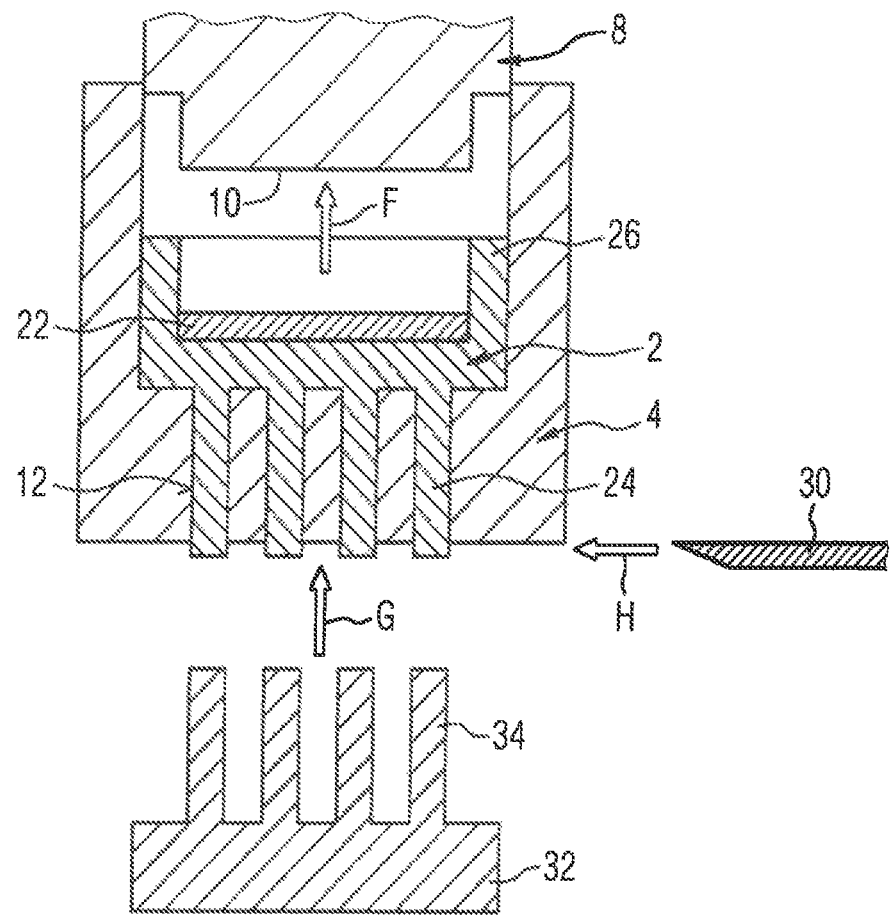

FIG. 4 shows a schematic sectional view of further method steps for producing a heat sink 2. After the pressing E, which is shown in FIG. 1, the fins 24 are cut to length H in the die 4. By way of example, the fins 24 are shortened to a uniform final length by means of cutting means 30. The cutting means 30 can comprise a sawing, milling and/or cutting apparatus. Subsequently, the punch 8 is released F from the material layer 22 and the heat sink 2 is ejected G from the die 4 by ejection means 32, which comprise ejector pins 34 which correspond to the fins 24. The further configuration of the method in FIG. 4 corresponds to that in FIG. 1.

Figure 5:
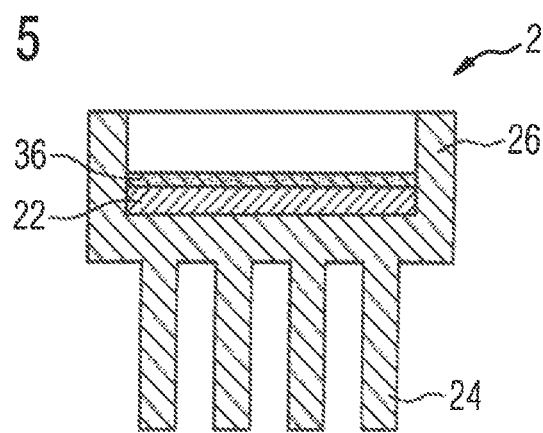

FIG. 5 shows a schematic sectional view of a heat sink 2 with a dielectric material layer 36, which comprises by way of example an organic insulator. The organic insulator can be filled, inter alia, with a ceramic material such as aluminum oxide and/or aluminum nitride. The dielectric material layer 36 is releasably connected between the pressure surface 10 of the punch 8 and the material layer 22 during the production of the heat sink 2. During the pressing (E), the dielectric material layer 36 is then pressed with the material layer 22. In addition, the heat sink 2 has lamellar fins 24. The further configuration of the heat sink 2 in FIG. 3 corresponds to that in FIG. 3.

Figure 6:
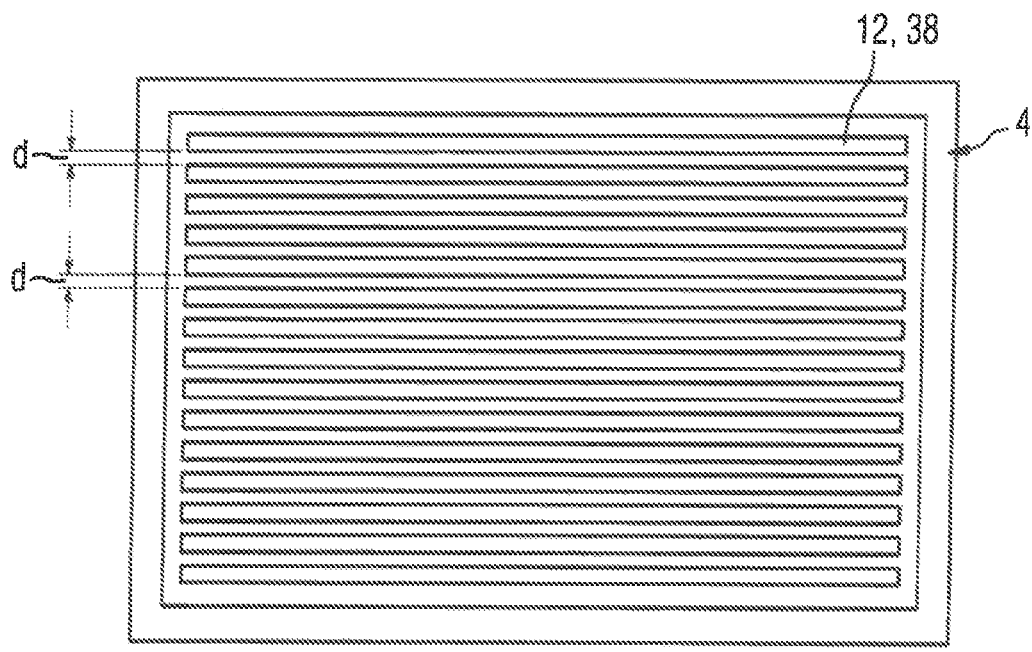

FIG. 6 shows a schematic representation of a die 4 with openings 12 in the form of rectangular elongated holes 38, in a plan view. Lamellar fins can be produced through such elongated holes 38. The rectangular elongated holes 38 are arranged running parallel and have identical spacings d. In order to achieve focused heat dissipation, in particular to avoid hot spots, the spacings d can be varied. The further configuration of the openings 12 in FIG. 6 corresponds to that in FIG. 1.

Figure 7:
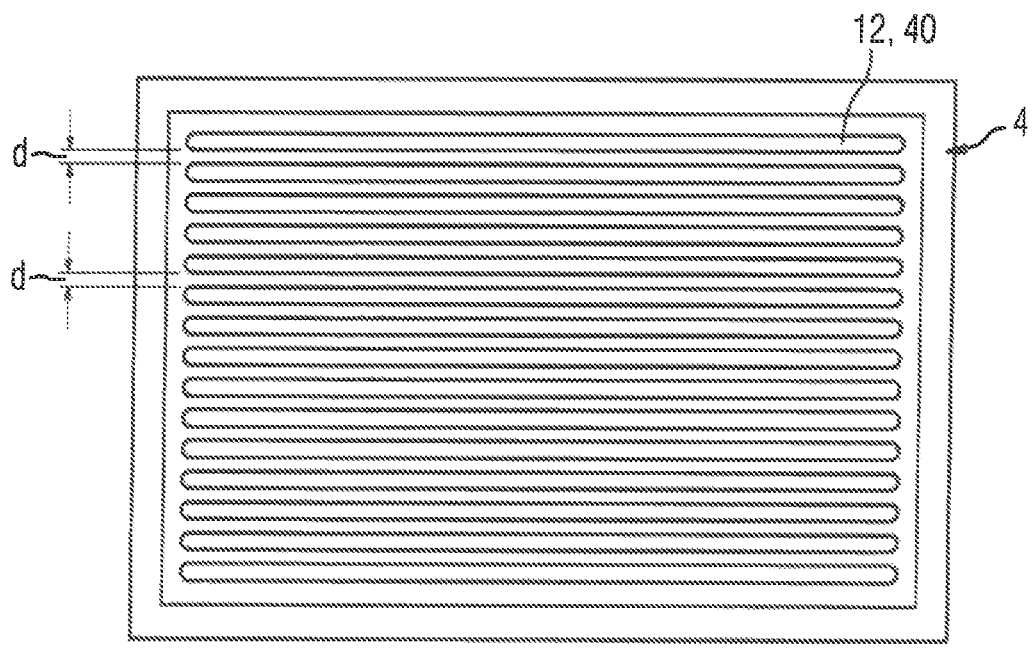

FIG. 7 shows a schematic representation of a die 4 with openings 12 in the form of rounded elongated holes 40, in a plan view. By way of example, the openings 12 are designed as semicircular rounded elongated holes 40. The further configuration of the openings 12 in FIG. 7 corresponds to that in FIG. 6.

FIG. 8 shows a schematic three-dimensional representation of a heat sink 2 with lamellar fins 24 which are arranged running parallel and have identical spacings d. in particular, the heat sink 2 is produced using a die 4 which is configured as in FIG. 6. A cooling fluid flow K runs along the parallel lamellar fins 24. The further configuration of the heat sink 2 in FIG. 8 corresponds to that in FIG. 3.

FIG. 9 shows a schematic sectional view of a semiconductor arrangement 42 with a heat sink 2. The semiconductor arrangement 42 comprises by way of example a semiconductor element 44, which is designed as a vertical power transistor, in particular as an insulated-gate bipolar transistor (IGBT). The IGBT is connected, in particular in a material-bonded manner, to a structured metallization 46 which is connected via the dielectric material layer 36 in an electrically insulating and thermally conductive manner to the heat sink 2. By way of example, the IGBT is connected in a material-bonded manner by the collector to the metallization 46. The material-bonded connection can be, inter alia, a soldered connection and/or a sintered connection, but also an adhesive connection, for example using an electrically and thermally conductive adhesive. Furthermore, the IGBT is connected by the gate and the emitter to the metallization 46 via bonding connections 48, in particular via bonding wires or bonding tapes. The semiconductor element 44 is completely encapsulated by a casting compound 50, wherein the casting compound 50 is delimited by the peripheral side wall 26 of the heat sink 2. The casting compound 50 comprises, by way of example, a soft casting compound, in particular a silicone casting compound. The further configuration of the heat sink 2 in FIG. 9 corresponds to that in FIG. 8.

FIG. 10 shows a schematic representation of a power converter 52 which comprises by way of example a semiconductor arrangement 42 with a heat sink 2. The semiconductor arrangement 42 in FIG. 10 is as shown in FIG. 9.

In summary, the invention relates to a method for producing a heat sink 2 with fins 24 and a peripheral side wall 26 by extrusion. In order to save costs, the following steps are proposed: providing A a die 4, which has a base surface 6, and a punch 8, which has a pressure surface 10, wherein the base surface 6 of the die 4 has openings 12, wherein a peripheral rebate 14 is formed on the pressure surface 10 of the punch 8, placing B a semifinished product 20 made of a first metal material into the die 4, releasably connecting C a material layer 22 made of a second metal material, which has a higher thermal conductivity than the first metal material, to the pressure surface 10 of the punch 8, bringing the punch 8 into contact D via the material layer 22 with the semifinished product 20 that is placed in the die 4, pressing E the first metal material of the semifinished product 20 by means of the punch 8 through the openings 12 of the die 4 so as to form the fins 24 and into the peripheral rebate 14 of the punch 8 so as to form the peripheral side wall 26, wherein the material layer 22 is connected over its entire surface to the first metal material of the semifinished product 20, wherein the heat sink 2 is formed by the pressing E, releasing F the punch 8 from the material layer 22, ejecting G the heat sink 2 from the die 4.

The invention claimed is:

1. A method for producing a heat sink with fins and a peripheral side wall by extrusion, the method comprising:
   providing a die, which includes a base surface having openings, and a punch, which has a pressure surface, with a peripheral rebate being formed on the pressure surface of the punch;
   placing a semifinished product made of a first metal material into the die;
   releasably connecting a material layer made of a second metal material of a thermal conductivity which is higher than a thermal conductivity of the first metal material, to the pressure surface of the punch;
   bringing the punch into contact via the material layer with the semifinished product in the die;
   forming the heat sink by pressing the first metal material of the semifinished product by the punch through the openings of the die so as to form the fins and into the peripheral rebate of the punch so as to form the peripheral side wall, wherein the material layer is connected over an entire surface of the material layer to the first metal material of the semifinished product;
   releasing the punch from the material layer; and
   ejecting the heat sink from the die.

2. The method of claim 1, further comprising cutting the fins in the die to length after the pressing.

3. The method of claim 1, wherein the material layer is releasably connected to the punch in such a way that the material layer is flush with the pressure surface of the punch.

4. The method of claim 1, wherein the material layer is connected in a material-bonded manner to the first metal material via a pressure welding connection.

5. The method of claim 1, further comprising roughening the material layer on a side facing away from the pressure surface of the punch.

6. The method of claim 5, wherein the material layer is connected to the first metal material via micro-interlocks.

7. The method of claim 1, further comprising configuring the openings of the die as elongated holes, wherein the first metal material of the semifinished product is pressed through the elongated holes of the die so as to form lamellar fins.

8. The method of claim 1, further comprising releasably connecting a dielectric material layer between the pressure surface of the punch and the material layer made of the second metal material, wherein the dielectric material layer is non-releasably connected to the material layer during the pressing.

9. The method of claim 1, wherein the die has an inner shell surface and the punch has an outer shell surface, wherein during the pressing the outer shell surface of the punch is moved running parallel flush with respect to the inner shell surface of the die.

10. The method of claim 1, wherein the first metal material is an aluminum alloy.

11. The method of claim 10, wherein the aluminum alloy contains silicon in a proportion by weight in a range of 0.1% to 1%.

12. The method of claim 10, wherein the aluminum alloy is a wrought aluminum alloy.

13. The method of claim 10, wherein the aluminum alloy contains silicon in a proportion by weight in a range of 0.1% to 0.5%.

14. The method of claim 1, further comprising cutting the fins in the die flush after the pressing.

* * * * *